United States Patent
Okazaki et al.

(10) Patent No.: US 9,654,063 B2
(45) Date of Patent: May 16, 2017

(54) BIAS CIRCUIT FOR USE WITH AMPLIFIER CIRCUIT, CONTROL METHOD THEREOF, AND SIGNAL AMPLIFIER

(71) Applicant: Panasonic Intellectual Property Management Co., Ltd., Osaka (JP)

(72) Inventors: Yukio Okazaki, Kanagawa (JP); Masakatsu Maeda, Kanagawa (JP); Shigeki Nakamura, Kanagawa (JP); Akinori Daimo, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/885,671

(22) Filed: Oct. 16, 2015

(65) Prior Publication Data

US 2016/0142014 A1 May 19, 2016

(30) Foreign Application Priority Data

Nov. 19, 2014 (JP) .................................. 2014-234823

(51) Int. Cl.
*H03F 3/04* (2006.01)
*H03F 3/193* (2006.01)
(Continued)

(52) U.S. Cl.
CPC ........... *H03F 3/193* (2013.01); *H03F 1/0261* (2013.01); *H03F 3/245* (2013.01); *H03F 1/301* (2013.01);
(Continued)

(58) Field of Classification Search
CPC .. H03G 3/30; H03F 1/302; H03F 3/04; H03F 3/343; H03F 3/345; H03F 2200/18;
(Continued)

(56) References Cited

U.S. PATENT DOCUMENTS

| 8,183,925 B2* | 5/2012 | Ohta | H03F 1/0266 330/296 |
| 8,890,617 B2* | 11/2014 | Marra | H03F 1/30 330/296 |
| 2013/0033327 A1* | 2/2013 | Kadoi | H03F 1/0211 330/285 |

FOREIGN PATENT DOCUMENTS

JP 2010-114736 5/2010

OTHER PUBLICATIONS

Masaki Kanemaru et al., "79 GHz CMOS circuits for phase/amplitude calibration in high-resolution beamforming radar systems" Proceedings of Radar Conference, Oct. 2013, pp. 303-306.

* cited by examiner

*Primary Examiner* — Khanh V Nguyen
(74) *Attorney, Agent, or Firm* — McDermott Will & Emery LLP

(57) ABSTRACT

A bias circuit comprises: a first circuit that comprises a first resistor and a decoupling capacitor; a bias voltage generation circuit that comprises a first transistor being connected to the first circuit; one or more switches; a first replica circuit comprising a second circuit and a second transistor, the second circuit comprising a second resistor and a capacitor, the second transistor being connected to the second circuit; a second replica circuit comprising a third transistor; a comparator that makes a comparison between a pseudo-bias voltage and a reference voltage; and a control circuit that controls the one or more switches on the basis of the comparison result to reduce the amount of the current flowing through the first transistor.

20 Claims, 4 Drawing Sheets

(51) Int. Cl.
*H03F 1/02* (2006.01)
*H03F 3/24* (2006.01)
*H03F 1/30* (2006.01)

(52) U.S. Cl.
CPC ...... *H03F 2200/18* (2013.01); *H03F 2200/27* (2013.01); *H03F 2200/451* (2013.01); *H03F 2200/453* (2013.01); *H03F 2200/541* (2013.01); *H03F 2200/555* (2013.01)

(58) Field of Classification Search
CPC ........ H03F 1/301; H03F 1/0205; H03F 3/193; H03F 3/21; H03F 2200/451; H03F 2200/27; H03F 3/245; H03F 1/0261
USPC .......................................... 330/285, 288, 296
See application file for complete search history.

BIAS CIRCUIT FOR USE WITH AMPLIFIER CIRCUIT, CONTROL METHOD THEREOF, AND SIGNAL AMPLIFIER

BACKGROUND

1. Technical Field

The present disclosure relates to a bias circuit for use with an amplifier circuit, a control method thereof, and a signal amplifier including the bias circuit.

2. Description of the Related Art

The FM-CW system, which is currently going mainstream among 79 GHz-band radar systems, transmits an FM-modulated signal at all times. For this reason, this system is disadvantageous in terms of power consumption. On the other hand, the pulse radar system, which is expected to be adopted in the future, uses a modulated pulse to improve distance resolution (for example, see M. Kanemaru, et al., "79 GHz CMOS circuits for phase/amplitude calibration in high resolution beamforming radar systems," Proceedings of Rader Conference (EuRAD), 2013 European, IEEE, pp. 303-306, October 2013). This system repeatedly transmits a pulse every predetermined time, that is, transmits a pulse intermittently and thus can reduce power consumption.

SUMMARY

One non-limiting and exemplary embodiment provides a bias circuit which is used for an amplifier circuit and which can quickly turn on or off the amplifier circuit.

In one general aspect, the techniques disclosed here feature a bias circuit which is used with an amplifier circuit and which includes a first circuit, a bias voltage generation circuit, one or more switches, a first replica circuit, a second replica circuit, a comparator, and a control circuit. The first circuit includes a first resistor and a decoupling capacitor and supplies a bias voltage to the amplifier circuit. The bias voltage generation circuit includes a first transistor and charges the decoupling capacitor through the first resistor. The first transistor is connected to the first circuit and generates the bias voltage. The one or more switches changes the amount of a current passing through the first transistor. The first replica circuit includes a second circuit and a second transistor. The second circuit includes a second resistor and a capacitor, and the second transistor is connected to the second circuit and generates a pseudo-bias voltage. The second replica circuit includes a third transistor that generates a reference voltage. The comparator makes a comparison between the pseudo-bias voltage and the reference voltage and outputs a comparison result signal indicating a result of the comparison. When the pseudo-bias voltage reaches or exceeds the reference voltage, the control circuit controls the one or more switches on the basis of the comparison result signal to reduce the amount of the current flowing through the first transistor.

According to the one aspect of the present disclosure, the bias circuit can quickly turn on or off the amplifier circuit. It should be noted that general or specific aspects of the present disclosure may be implemented as a bias circuit, a signal amplifier, a control method, a device, an apparatus, a system or any combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
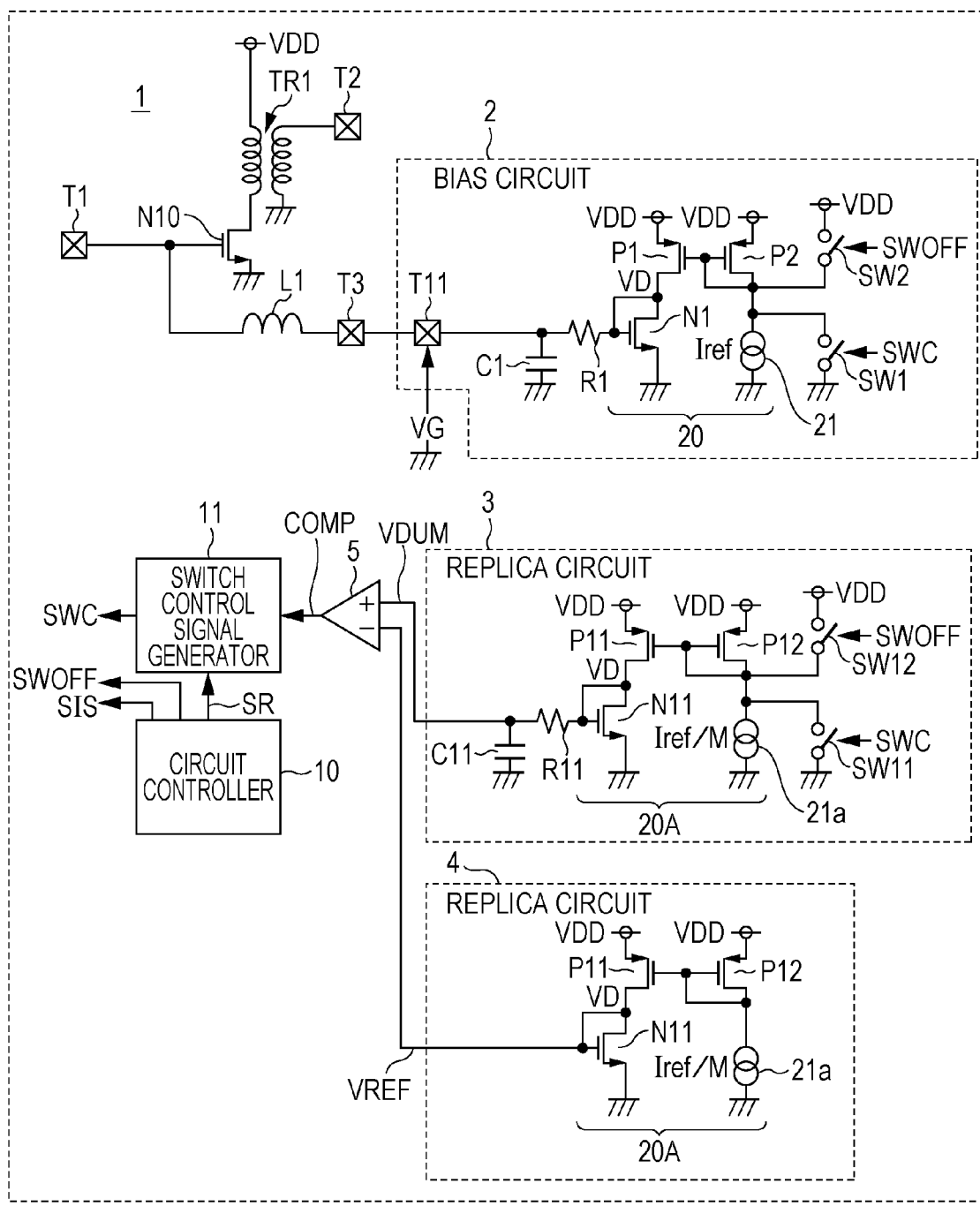
FIG. 1 is a circuit diagram showing the configurations of a high-frequency amplifier circuit, a bias circuit, and peripheral circuits of the bias circuit according to a first embodiment.

Underlying Knowledge Forming Basis of the Present Disclosure

The pulse radar system repeatedly transmits a pulse every predetermined time, that is, transmits a pulse intermittently and thus can reduce power consumption. However, even in the pulse radar system, a bias current flows through the power amplifier (PA) and others in the time period during which no pulse is transmitted. Even when the bias current is turned on or off according to the required transmission duty ratio (about 10%), a circuit start-up time equivalent to about 20% is required. This is an obstacle to reductions in power consumption. For this reason, a method for starting up the circuit quickly is required. Specifically, it is desirable to reduce the start-up time to less than 100 ns. It is more desirable to reduce the start-up time to 10 ns to several tens of ns.

For example, in order to enable a quick intermittent operation based on a start and stop of 100 ns or less with low noise, a low-noise amplifier (LNA) of Japanese Unexamined Patent Application Publication No. 2010-114736 is provided. The LNA includes: a first amplifier that inputs a signal and a bias voltage from an input terminal to the gate of a transistor through a capacitance and a first resistor, respectively, and outputs the amplified signal from the drain; a second amplifier that inputs the output signal of the first amplifier to the gate of one transistor differentially connected through a capacitance and to the gate of the other transistor differentially connected through a second resistor and outputs the amplified differential signal from the respective drains; and intermittent operation controller that turns on or off the connection state between the first and second amplifiers and a power supply in accordance with a first control signal to control operating and nonoperating states of the first and second amplifiers. The LNA further includes state transition controller that when making a transition from an operating state to a nonoperating state or a transition from a nonoperating state to an operating state, makes the transition while reducing the resistance values of the first and second resistors for a predetermined time.

Specifically, in Japanese Unexamined Patent Application Publication No. 2010-114736, a switch is disposed in parallel with the first resistor serving as a bias resistor and, when starting the amplifier, the bias voltage is set to a predetermined voltage quickly by closing this switch. However, typically, the disposition of a switching element on the bias line of an amplifier circuit for high frequencies such as extremely high frequencies causes changes in the electrical characteristics of the high-frequency amplifier, thereby failing to provide desired characteristics. Consequently, there occur problems such as intermodulation distortion.

In view of the foregoing, the present inventors intensively conducted research in order to provide a bias circuit which is used in an amplifier circuit for high frequencies such as extremely high frequencies and can quickly turn on or off the high-frequency amplifier circuit without changing the electrical characteristics of the high-frequency amplifier circuit. A bias circuit according to an embodiment of the present disclosure can quickly charges a decoupling capacitor. Further, since there is no switch (MOS transistor or the like) on the bias line of the high-frequency amplifier circuit, the bias circuit can turn on or off the high-frequency amplifier circuit without changing the electrical characteristics of the high-frequency amplifier circuit. Thus, when transmitting a pulse intermittently using the high-frequency amplifier circuit, it is possible to reduce the excess start-up time and thus to reduce power consumption.

Now, embodiments of the present disclosure will be described with reference to the drawings. Throughout the embodiments, same or similar elements are given the same reference signs.

First Embodiment

FIG. 1 is a circuit diagram showing the configurations of a high-frequency amplifier circuit 1, a bias circuit 2, and peripheral circuits of the bias circuit 2 according to a first embodiment. As shown in FIG. 1, a circuit according to the first embodiment includes the high-frequency amplifier circuit 1, which amplifies high-frequency signals such as extremely-high-frequency signals, the bias circuit 2, replica circuits 3 and 4 of the bias circuit 2, a comparator 5, a circuit controller 10, and a switch control signal generator 11. The high-frequency signals may be signals at a 30 GHz or higher.

In FIG. 1, the high-frequency amplifier circuit 1 includes an n-channel MOS transistor N10 that amplifies high-frequency signals such as extremely-high-frequency signals, terminals T1 to T3, a transformer TR1, and a high-frequency blocking inductor L1. A bias voltage VG from the bias circuit 2 is applied to the gate of the n-channel MOS transistor N10 through the terminal T3 and inductor L1. A power supply voltage VDD is applied to the drain of the n-channel MOS transistor N10 through the primary side of the transformer TR1. One terminal of the secondary side of the transformer TR1 is connected to the terminal T2, and the other terminal is grounded. A high-frequency signal inputted to the terminal T1 is inputted to the gate of the n-channel MOS transistor N10 and amplified, and then outputted from the terminal T2 through the transformer TR1.

The bias circuit 2 includes p-channel MOS transistors P1 and P2, an n-channel MOS transistor N1, a current source 21 having a constant current Iref, a resistor R1, a decoupling capacitor C1, switches SW1 and SW2, and a terminal T11. In the bias circuit 2, the p-channel MOS transistor P2 having a gate and drain shorted to each other and the current source 21 are connected between a power supply voltage VDD and a ground. The switch SW2, which is controlled by a switch control signal SWOFF, is connected in parallel with the p-channel MOS transistor P2. The switch SW1, which is on/off controlled by a switch control signal SWC, is connected in parallel with the current source 21. The p-channel MOS transistor P1 and the n-channel MOS transistor N1 having a gate and drain shorted to each other are connected between the power supply voltage VDD and the ground. The gate of the n-channel MOS transistor N1 is connected to the terminal T11 through the resistor R1 and grounded through the decoupling capacitor C1.

In the bias circuit 2, the circuit except for the terminal T11, resistor R1, decoupling capacitor C1, and switches SW1 and SW2 (that is, the circuit including the p-channel MOS transistors P1 and P2, n-channel MOS transistor N1, and current source 21) is referred to as a bias voltage generation circuit 20.

In the bias circuit 2 thus configured, when the switch SW2 is on, the current does not flow through the p-channel MOS transistor P2, so that the bias circuit 2 does not generate the bias voltage VG. In the bias circuit 2, the p-channel MOS transistors P1 and P2 form a current mirror circuit. When turning off the switch SW2, a current corresponding to the current flowing through the p-channel MOS transistor P2 flows through p-channel MOS transistor P1 and n-channel MOS transistor N1.

Specifically, when turning off the switch SW2 and turning on the switch SW1, a current corresponding to the relatively large current flowing through the p-channel MOS transistor P2 flows through the p-channel MOS transistor P1 and n-channel MOS transistor N1. At this time, the drain voltage VD of the n-channel MOS transistor N1 is applied to the decoupling capacitor C1 through the resistor R1. Thus, the decoupling capacitor C1 is quickly charged, so that the bias voltage VG is increased. As a result, the charge of the decoupling capacitor C1 is completed within 100 ns. Further, when turning off the switch SW1, a current corresponding to the predetermined current flowing through the p-channel MOS transistor P2 flows through the p-channel MOS transistor P1 and n-channel MOS transistor N1. At this time, the drain voltage of the n-channel MOS transistor N1 is outputted as the bias voltage VG to the high-frequency amplifier circuit 1 through the resistor R1 and terminal T11.

The replica circuit 3 is a replica circuit of the bias circuit 2 and has a similar configuration to that of the bias circuit 2. That is, the replica circuit 3 includes p-channel MOS transistors P11 and P12, an n-channel MOS transistor N11, a current source 21a having a constant current Iref/M, a resistor R11, a capacitor C11, and switches SW11 and SW12. As used herein, M is a number greater than or equal to 1 and may be a natural number. By setting M to a natural number, yield can be increased. The replica circuit 3 differs from the bias circuit 2 in the following points:

(1) The size of the p-channel MOS transistor P11 is 1/M that of the p-channel MOS transistor P1.
(2) The size of the p-channel MOS transistor P12 is 1/M that of the p-channel MOS transistor P2.
(3) The size of the n-channel MOS transistor N11 is 1/M that of the n-channel MOS transistor N1.
(4) The current source 21a supplies the constant current Iref/M.
(5) The resistance value of the resistor R11 is 1/M that of the resistor R1.

The capacitor C11 has the same capacitance as that of the decoupling capacitor C1. In the replica circuit 3, the circuit except for the resistor R11, capacitor C11, switches SW11 and SW12 (that is, the circuit including the p-channel MOS transistors P11 and P12, n-channel MOS transistor N11, and current source 21a) is referred to as a bias voltage generation circuit 20A.

Although the replica circuit 3 thus configured differs from the bias circuit 2 in transistor size and the like, it generates a bias voltage having a waveform same or similar to that of the bias circuit 2. The replica circuit 3 outputs the generated bias voltage as a pseudo-bias voltage VDUM to the non-inverted input terminal of the comparator 5.

The replica circuit 4 is yet another replica circuit of the bias circuit 2 and includes a bias voltage generation circuit 20A including p-channel MOS transistors P11 and P12, an n-channel MOS transistor N11, and a current source 21a having a constant current Iref/M. As used herein, M is a number greater than or equal to 1 and may be a natural number. The replica circuit 4 has a configuration same or similar to that of the bias circuit 2, except for the following points:

(1) The size of the p-channel MOS transistor P11 is 1/M that of the p-channel MOS transistor P1.
(2) The size of the p-channel MOS transistor P12 is 1/M that of the p-channel MOS transistor P2.
(3) The size of the n-channel MOS transistor N11 is 1/M that of the n-channel MOS transistor N1.
(4) The current source 21a supplies the constant current Iref/M.
(5) The replica circuit 4 does not include either of the resistor R1 or capacitor C1.
(6) The replica circuit 4 does not include either of the switches SW1 and SW2.

The purpose of setting the transistor sizes, resistance values, and constant current values of the replica circuits 3 and 4 to 1/M of those of the bias circuit 2 is to cause the replica circuits 3 and 4 to operate as does the bias circuit 2 while reducing the power consumption of the replica circuits 3 and 4.

The replica circuit 4 has a circuit configuration similar to that of the replica circuit 3.

In the replica circuit 4 thus configured, the p-channel MOS transistors P11 and P12 form a current mirror circuit. Accordingly, a current corresponding to the current flowing through the p-channel MOS transistor P12 flows through the p-channel MOS transistor P11 and n-channel MOS transistor N11. The n-channel MOS transistor N11 generates a drain voltage VD and outputs it as a reference voltage VREF to the inverted input terminal of the comparator 5.

The comparator 5 makes a comparison between the pseudo-bias voltage VDUM and the reference voltage VREF, generates a comparison result signal COMP indicating the result of the comparison, and outputs the signal to the switch control signal generator 11. The circuit controller 10 generates predetermined control signals, including a transmission period signal SIS indicating the transmission period of the output signal of the high-frequency amplifier circuit 1 and a reset signal SR, and also generates a switch control signal SWOFF for on/off controlling the switch SW2. The circuit controller 10 outputs the reset signal SR to the switch control signal generator 11. The switch control signal generator 11 generates a switch control signal SWC for controlling the switch SW1, on the basis of the comparison result signal COMP and the control signal and outputs the switch control signal.

Figure 2:
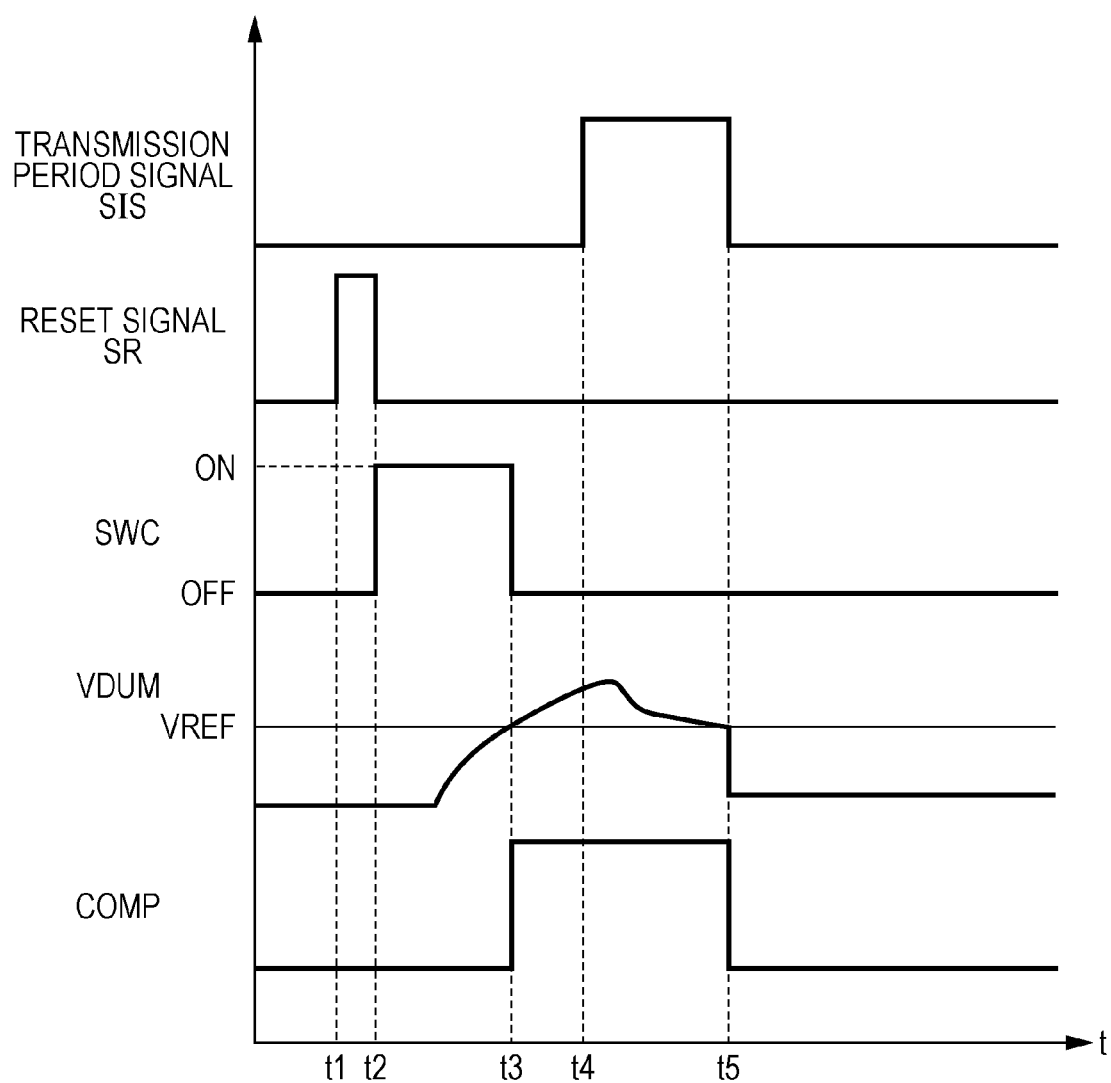
FIG. 2 is a signal timing chart showing the operations of the circuits in FIG. 1.

FIG. 2 is a signal timing chart showing the operations of the circuits in FIG. 1. Initially, both the switches SW2 and SW12 are on, and the bias circuit 2 and replica circuit 3 are deactivated. At time t1, the circuit controller 10 turns on the reset signal SR and turns off the switches SW2 and SW12 using the switch control signal SWOFF. Subsequently, at time t2, the circuit controller 10 turns off the reset signal SR. The switch control signal generator 11 changes the state of the switch control signal SWC from an off state to an on state to change the states of the switches SW1 and SW11 from off states to on states. Thus, the current flowing through the p-channel MOS transistor P2 is increased, and the current flowing through the p-channel MOS transistor P1 is increased accordingly. The drain voltage VD of the n-channel MOS transistor N1 is also increased and thus the decoupling capacitor C1 is charged quickly. As a result, the bias voltage VG is increased.

Further, the current flowing through the p-channel MOS transistor P12 of the replica circuit 3 is increased, and the current flowing through the p-channel MOS transistor P11 is increased accordingly. The drain voltage VD of the n-channel MOS transistor N11 is also increased and thus the capacitor C11 is charged quickly. As a result, the pseudo-bias voltage VDUM is also increased. When the pseudo-bias voltage VDUM reaches or exceeds the reference voltage VREF (time t3), the level of the comparison result signal COMP is changed from a low level to a high level. Based on the change of the comparison result signal COMP, the switch control signal generator 11 turns off the switch control signal SWC to turn off the switches SW1 and SW11. As a result, the currents flowing through the p-channel MOS transistors P1 and P11 are reduced. Thus, it is possible to prevent the bias voltage VG from being increased excessively. Subsequently, at predetermined time t4, the circuit controller 10 generates a transmission period signal SIS and transmits it to a circuit (such as a baseband unit) for generating a transmission signal.

The bias voltage VG and pseudo-bias voltage VDUM are moderately increased due to the turn-off of the switches SW1 and SW11 for a while and then moderately reduced due to the discharge of the transistors N1 and N11. At predetermined time t5, the circuit controller 10 turns off the transmission period signal SIS and turns on the switch control signal SWOFF. Thus, the switches SW2 and SW12 are turned on, so that the bias circuit 2 and replica circuit 3 are deactivated. Further, the decoupling capacitor C1 and capacitor C11 are discharged through the resistors R1 and R11 and transistors N1 and N11, so that the bias voltage VG and pseudo-bias voltage VDUM return to 0.

In the first embodiment thus configured, the switch SW1 is disposed in parallel with the current source 21 rather than disposing the switch in parallel with the bias resistor. Thus, when turning on the switch SW2 and thus turning off the bias circuit 2, it is possible to prevent adverse effects such as the degradation of electrical characteristics. In this method, however, when the switch SW1 is on, the drain voltage VD of the p-channel MOS transistor P1 is the power supply voltage VDD and therefore the bias voltage VG may be increased excessively unless the timing of turn-off of the switch SW1 is controlled accurately. As a countermeasure, there are disposed the replica circuit 3, which has a configuration similar to that of the bias circuit 2, and the replica circuit 4, which outputs the desired reference voltage VREF; the outputs of these circuits are compared; and the switch SW1 is controlled based on the comparison result. Thus, when the bias voltage VG reaches the desired reference voltage VREF, the switch SW1 can be turned off accurately. As a result, it is possible to speed up the start of the high-frequency amplifier circuit 1 compared to the time constants of R1 and C1, as well as to reduce the power consumption of the high-frequency amplifier circuit 1 without affecting the electrical characteristics thereof.

While the high-frequency amplifier circuit 1 is disclosed in the first embodiment, the high-frequency amplifier circuit 1 is illustrative only. The first embodiment is applicable to any types of high-frequency amplifier circuits using a bias voltage VG.

Second Embodiment

Figure 3:
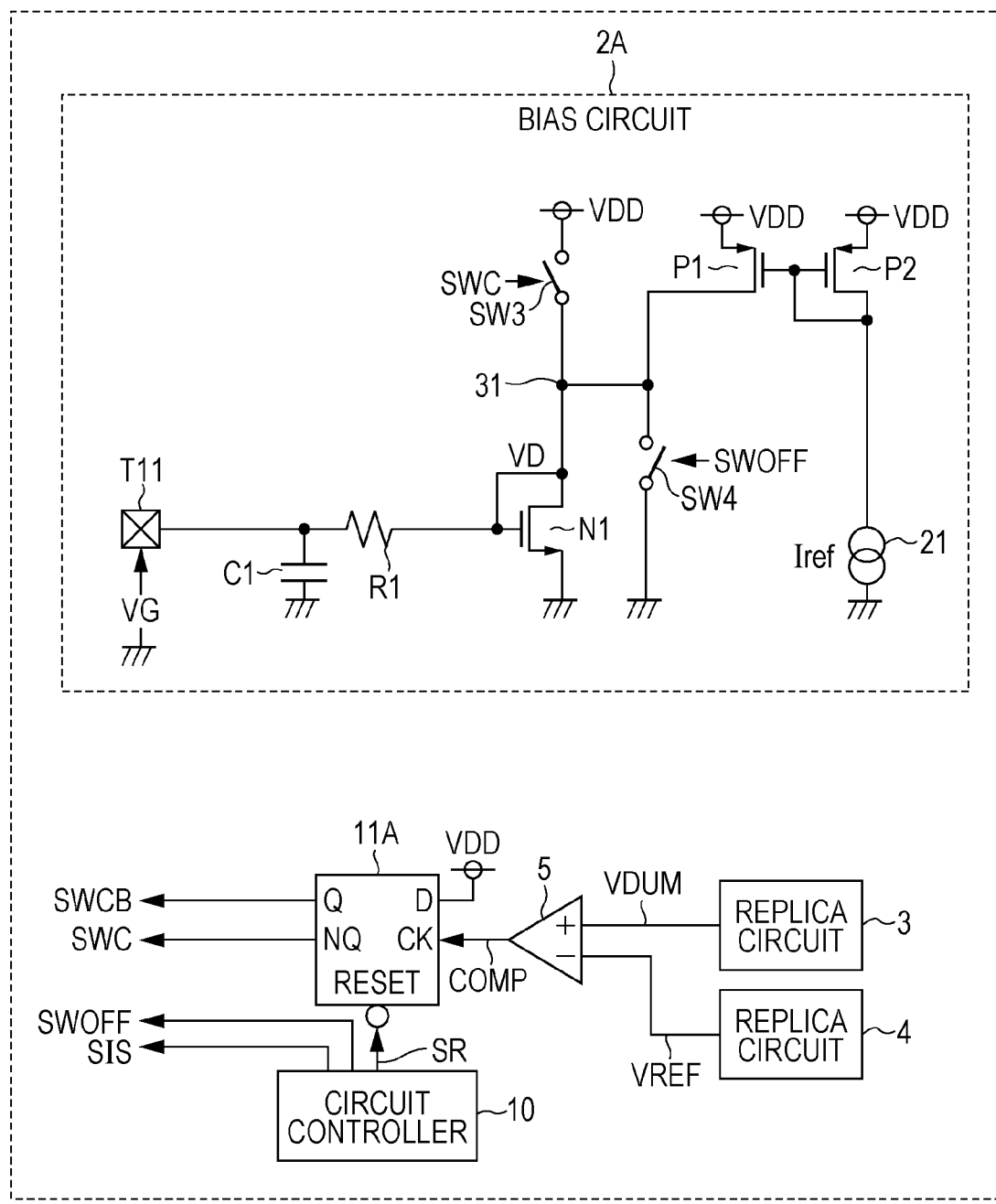
FIG. 3 is a circuit diagram showing the configurations of a bias circuit for use with a high-frequency amplifier circuit and peripheral circuits of the bias circuit according to a second embodiment.

FIG. 3 is a circuit diagram showing the configurations of a bias circuit 2A for use with a high-frequency amplifier circuit 1 and peripheral circuits thereof according to a second embodiment. The circuit of the second embodiment is the same as that of the first embodiment except for the following points:

(1) The circuit of the second embodiment includes the bias circuit 2A in place of the bias circuit 2.
(2) The circuit of the second embodiment includes a delay flip-flop 11A in place of the switch control signal generator 11.
(3) The circuit of the second embodiment includes a replica circuit 3 having a configuration similar to that of the bias circuit 2A in place of the replica circuit 3 of the first embodiment.

The above points will be described in detail below.

The bias circuit 2A includes switches SW3 and SW4 in lieu of the switches SW1 and SW2 of the bias circuit 2 of the first embodiment. A power supply voltage VDD is connected to the drain of an n-channel MOS transistor N1 through the switch SW3 and a connection point 31. The drain of a p-channel MOS transistor P1 is connected to the connection point 31 and grounded through the switch SW4. Of course, the replica circuit 3 according to the second embodiment is obtained by changing the positions of the switches to the same positions as those of the bias circuit 2A in the replica circuit 3 of the first embodiment. That is, two switches are disposed in lieu of the switches SW11 and SW12. One of the two switches is disposed between a power supply voltage VDD and the connection point of an n-channel MOS transistor N11 and a p-channel MOS transistor P11. The other switch is disposed between the connection point and the ground.

The delay flip-flop 11A receives a high-level power supply voltage VDD at the input terminal (D) thereof, as well as receives a comparison result signal COMP from a comparator 5 at the clock input terminal (CK) thereof. The delay flip-flop 11A also receives a reset signal SR from a circuit controller 10 at the reset input terminal thereof. The circuit controller 10 generates a switch control signal SWOFF for on/off controlling the switch SW4 and outputs it to the switch SW4. The delay flip-flop 11A is reset based on the reset signal SR and then temporarily holds a signal received at the input terminal (D) on the basis of the comparison result signal COMP received at the clock input terminal (CK). The delay flip-flop 11A then outputs the held signal as a switch control signal SWC from the inverted output terminal (NQ) thereof, as well as outputs a switch control signal SWCB from the non-inverted output terminal (Q) thereof.

The bias circuit 2A thus configured directly turns on or off the n-channel MOS transistor N1 for generating a bias voltage, using the switch SW4 rather than turning on or off the current mirror circuit formed by the p-channel MOS transistors P1 and P2 as is done in the bias circuit 2 of the first embodiment. Further, the bias circuit 2A does not control the current of the current mirror circuit. That is, the bias circuit 2A directly increases or reduces the current of the n-channel MOS transistor N1 for generating a bias voltage, using the switch SW3 rather than increasing or reducing the current flowing through the current mirror circuit. The other operations of the second embodiment are same or similar to those of the first embodiment described with reference to FIG. 2. Thus, as in the first embodiment, it is possible to speed up the start of the high-frequency amplifier circuit 1 compared to the time constants of R1 and C1, as well as to reduce the power consumption of the high-frequency amplifier circuit 1 without affecting the electrical characteristics thereof.

Third Embodiment

Figure 4:
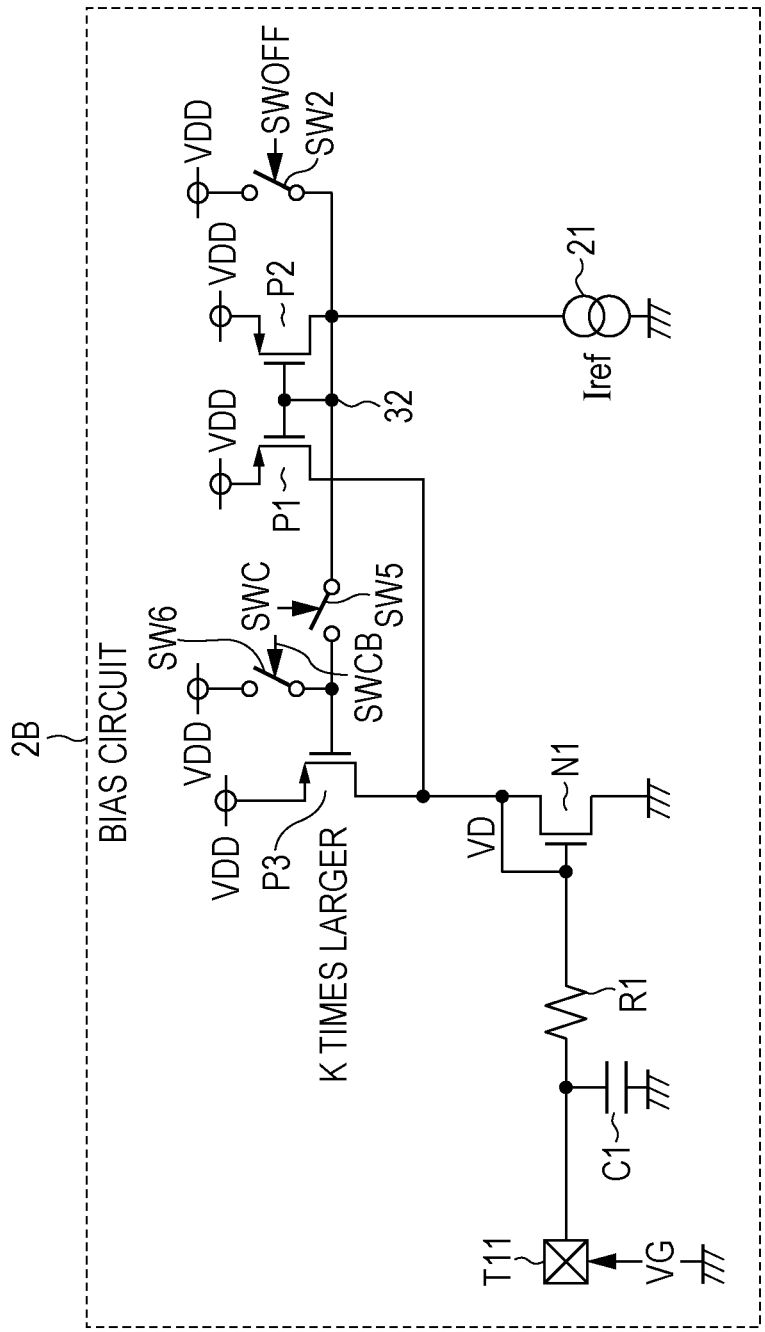
FIG. 4 is a circuit diagram showing the configuration of a bias circuit for use with a high-frequency amplifier circuit according to a third embodiment.

FIG. 4 is a circuit diagram showing the configuration of a bias circuit 2B for use with a high-frequency amplifier circuit 1 according to a third embodiment. The circuit of the third embodiment is the same as that of the second embodiment except for the following points:

(1) The circuit of the third embodiment includes the bias circuit 2B in place of the bias circuit 2A.
(2) The circuit of the third embodiment includes a replica circuit 3 having a configuration similar to that of the bias circuit 2B in place of the replica circuit 3 of the second embodiment.

For a circuit controller 10 and delay flip-flop 11A, those according to the second embodiment shown in FIG. 3 are used.

The bias circuit 2B is the same as the bias circuit 2A of the second embodiment except for the following points:

(1) The bias circuit 2B includes, in lieu of the switch SW3, a switch SW5 which is on/off controlled by a switch control signal SWC and a switch SW6 which is on/off controlled by a switch control signal SWCB serving as an inverted signal of the switch control signal SWC. The bias circuit 2B also includes a switch SW2 as in the first embodiment in lieu of the switch SW4.
(2) The bias circuit 2B further includes a p-channel MOS transistor P3 which is K times (K>1) larger in size than p-channel MOS transistors P1 and P2.

In the bias circuit 2B of FIG. 4, the gates of the p-channel MOS transistors P1 and P2 are connected to the gate of the p-channel MOS transistor P3 through a connection point 32 and a switch SW5, and the gate of the p-channel MOS transistor P3 is connected to a power supply voltage VDD through a switch SW6. The power supply voltage VDD is connected to the drain of an n-channel MOS transistor N1 through the p-channel MOS transistor P3. Of course, the replica circuit 3 according to the third embodiment is obtained by changing the positions of the switches in the replica circuit 3 of the first embodiment to the same positions as those of the bias circuit 2B and adding a transistor whose size is 1/M that of the p-channel MOS transistor P3. That is, the added transistor is disposed between a power supply voltage VDD and the connection point of an n-channel MOS transistor N11 and a p-channel MOS transistor P11 (first connection point). Further, two switches are disposed in lieu of the switch SW11. One of the two switches is disposed between the gate of the added transistor and the connection point of a current source 21a and a p-channel MOS transistor P12 (second connection point). The other switch is disposed between the power supply voltage VDD and the gate of the added transistor.

The bias circuit 2B thus configured turns on or off a current mirror circuit formed by the p-channel MOS transistors P1 and P2 using the switch SW2, as is done in the bias circuit 2 of first embodiment. However, the bias circuit 2B does not control the current of the current mirror circuit. That is, the bias circuit 2B directly turns on or off the p-channel MOS transistor P3 using the switches SW5 and SW6 rather than increasing or reducing the current flowing through the current mirror circuit. the p-channel MOS transistor P3 is configured to control the current mirror and connected to the n-channel MOS transistor N1 of the bias circuit 2B. The switches SW5 and SW6 are controlled by the switch control signals SWC and SWCB, which are inverse to each other. The other operations of the third embodiment are same or similar to those of the first embodiment described with reference to FIG. 2. In the time period in which the switch SW5 is on and the switch SW6 is off, the p-channel MOS transistor P3 causes a current in n-channel MOS transistor N1 which is K times larger than those in the first and second embodiments. Thus, a charging capacitor C1 can be charged more quickly.

According to the third embodiment, as in the first and second embodiments, it is possible to speed up the start of the high-frequency amplifier circuit 1 compared to the time constants of R1 and C1, as well as to reduce the power consumption of the high-frequency amplifier circuit 1 without affecting the electrical characteristics thereof.

Note that the p-channel MOS transistors P1 and P2 forming a current mirror circuit determines the operating point of the n-channel MOS transistor N1 for current source for the bias circuit 2 of the high-frequency amplifier circuit 1. Accordingly, the switching speed cannot be increased by turning on or off the current mirror circuit itself.

While the MOS transistors are used in the first to third embodiments, transistors of types other than the MOS transistors may be used. For example, bipolar transistors may be used in place of the MOS transistors. Further, in the first to third embodiments, n-channel transistors may be used in place of the p-channel transistors, and p-channel transistors may be used in place of the n-channel transistors. While the current mirror circuits are used in the first to third embodiments, a bias voltage, a pseudo-bias voltage, and a reference voltage may be generated using circuits other than the current mirror circuits. For example, a bias voltage, a pseudo-bias voltage, and a reference voltage may be generated by circuits using diodes. Further, the elements of the first to third embodiments may be combined. For example, in the first embodiment, the delay flip-flop 11A may be used in place of the switch control signal generator 11. In the second or third embodiment, the switch control signal generator 11 may be used in place of the delay flip-flop 11A.

The circuit controller 10, switch control signal generator 11 and the delay flip-flop 11A shown in FIGS. 1 and 3 may be implemented by one or more electronic circuits, including a semiconductor device, semiconductor integrated circuit (IC), or LSI (large scale integration). The LSI or IC may be packed on a single chip or may be formed by combining multiple chips. For example, the function blocks other than the storage device may be packed in a single chip. The LSI or IC as used herein may be referred to as a system LSI, VLSI (very large scale integration), or ULSI (ultra large scale integration) depending on the packing density. A field programmable gate array (FPGA), which is programmed after manufacturing the LSI or a reconfigurable logic device which can re-configure the junction relationship in the LSI or set up the circuit partition in the LSI may be used for the same purpose.

Further, all or some functions or processes of the circuit controller 10, switch control signal generator 11 and the delay flip-flop 11A can be performed by software. In this case, the software is recorded in one or more non-transitory recording media such as a ROM, an optical disk, or a hard disk drive, and when the software is executed by a processor, the software causes the processor and peripheral devices to perform particular functions in the software. The system or device may include the one or more non-transitory recording media having the software recorded thereon, the processor, and required hardware devices, for example, an interface.

Summary of Embodiments

A bias circuit for use with a high-frequency amplifier circuit according to a first aspect is a bias circuit which is used with a high-frequency amplifier circuit and which generates a predetermined bias voltage using a predetermined bias voltage generation circuit, charges a decoupling capacitor through a resistor, and supplies the bias voltage to the high-frequency amplifier circuit. The bias circuit includes: a quick charging circuit that quickly charges the decoupling capacitor; a first replica circuit that includes a circuit similar to the bias voltage generation circuit, a resistor similar to the resistor, and a capacitor similar to the decoupling capacitor and generates a pseudo-bias voltage similar to the bias voltage generated by the bias circuit; a second replica circuit that has a configuration similar to a configuration of the bias voltage generation circuit and generates a predetermined reference voltage; comparator that makes a comparison between the pseudo-bias voltage and the reference voltage and generates and outputs a comparison result signal; and controller that when the pseudo-bias voltage exceeds the reference voltage, turns off the quick charging circuit on the basis of the comparison result signal.

According to a bias circuit of a second aspect, in the bias circuit of the first aspect, the bias voltage generation circuit includes: a first p-channel MOS transistor and a current source connected between a power supply voltage and a ground; a second p-channel MOS transistor and an n-channel MOS transistor connected between the power supply voltage and the ground, the n-channel MOS transistor being configured to generate a bias voltage; and a switch connected in parallel with the current source. The first p-channel MOS transistor and second p-channel MOS transistor form a current mirror circuit. The controller turns on the quick charging circuit by turning on the switch and, subsequently when the pseudo-bias voltage exceeds the reference voltage, turns off the quick charging circuit by turning off the switch.

According to a bias circuit of a third aspect, in the bias circuit of the first aspect, the bias voltage generation circuit includes: a first p-channel MOS transistor and a current source connected between a power supply voltage and a ground; a second p-channel MOS transistor and an n-channel MOS transistor connected between the power supply voltage and the ground through a connection point, the n-channel MOS transistor being configured to generate a bias voltage; and a switch connected between the power supply voltage and the connection point. The first p-channel MOS transistor and second p-channel MOS transistor form a current mirror circuit. The controller turns on the quick charging circuit by turning on the switch and, subsequently when the pseudo-bias voltage exceeds the reference voltage, turns off the quick charging circuit by turning off the switch.

According to a bias circuit of a fourth aspect, in the bias circuit of the first aspect, the bias voltage generation circuit includes: a first p-channel MOS transistor and a current source connected between a power supply voltage and a ground through a connection point; a second p-channel MOS transistor and an n-channel MOS transistor connected between the power supply voltage and the ground, the n-channel MOS transistor being configured to generate a bias voltage; and a third p-channel MOS transistor which is larger in size than each of the first and second p-channel MOS transistors; and a switch connected between the connection point and a gate of the third p-channel MOS transistor. The first p-channel MOS transistor and second p-channel MOS transistor form a current mirror circuit. The controller turns on the quick charging circuit by turning on the switch and, subsequently when the pseudo-bias voltage exceeds the reference voltage, turns off the quick charging circuit by turning off the switch.

A high-frequency amplifier circuit according to a fifth aspect is a high-frequency amplifier circuit for amplifying high-frequency signals and includes the bias circuit according to any one of the first to fourth aspects.

A method according to a sixth aspect is a method for controlling a bias circuit which is used with a high-frequency amplifier circuit and which generates a predetermined a bias voltage using a predetermined bias voltage generation circuit, charges a decoupling capacitor through a resistor, and supplies the bias voltage to the high-frequency amplifier circuit. The bias circuit includes: a quick charging circuit that quickly charges the decoupling capacitor; a first replica circuit that includes a circuit similar to the bias voltage generation circuit, a resistor similar to the resistor, and a charging capacitor similar to the decoupling capacitor and generates a pseudo-bias voltage similar to the bias voltage generated by the bias circuit; and a second replica circuit that has a configuration similar to a configuration of the bias voltage generation circuit and generates a predetermined reference voltage. The control method includes: making a comparison between the pseudo-bias voltage and the reference voltage and generating and outputting a comparison result signal by a comparator; and when the pseudo-bias voltage exceeds the reference voltage, turning off the quick charging circuit on the basis of the comparison result signal by a controller.

While the high-frequency amplifier circuit, which amplifies high-frequency signals such as extremely-high-frequency signals, is disclosed in the above embodiments, the present disclosure is not limited thereto. The present disclosure is also applicable to high-frequency amplifier circuits that amplify high-frequency signals such as super-high-frequency signals, sub-extremely-high-frequency signals, or extremely-high-frequency signals.

A bias circuit for use with an amplifier circuit according to a seventh aspect includes: a first circuit that includes a first resistor and a decoupling capacitor and supplies a bias voltage to the amplifier circuit; a bias voltage generation circuit that includes a first transistor and charges the decoupling capacitor through the first resistor, the first transistor being connected to the first circuit and generating the bias voltage; one or more switches that change the amount of a current passing through the first transistor; a first replica circuit including a second circuit and a second transistor, the second circuit including a second resistor and a capacitor, the second transistor being connected to the second circuit and generating a pseudo-bias voltage; a second replica circuit including a third transistor that generates a reference voltage; a comparator that makes a comparison between the pseudo-bias voltage and the reference voltage and outputs an comparison result signal indicating a result of the comparison; and a control circuit that when the pseudo-bias voltage reaches or exceeds the reference voltage, controls the one or more switches on the basis of the comparison result signal to reduce the amount of the current flowing through the first transistor.

According to a bias circuit of an eighth aspect, in the bias circuit of the seventh aspect, the bias voltage generation circuit further includes a first current mirror circuit connected to the first transistor, the first replica circuit further includes a second current mirror circuit connected to the second transistor, and the second replica circuit further includes a third current mirror circuit connected to the third transistor.

According to a bias circuit of a ninth aspect, in the bias circuit of the eighth aspect, the one or more switches are connected to the first current mirror circuit and changes the current flowing through the first transistor by changing a current flowing through the first current mirror circuit.

According to a bias circuit of a tenth aspect, in the bias circuit of the ninth aspect, the bias voltage generation circuit further includes a current source connected to the ground, the first transistor is connected to the ground, the first current mirror circuit includes a fourth transistor connected between a power supply voltage and the current source and a fifth transistor connected between the power supply voltage and the first transistor, and the one or more switches are connected in parallel with the current source.

According to a bias circuit of an eleventh aspect, in the bias circuit of the tenth aspect, the first, second, and third transistors are n-channel MOS transistors, and the fourth and fifth transistors are p-channel MOS transistors.

According to a bias circuit of a twelfth aspect, in the bias circuit of eighth aspect, the one or more switches are connected to the first transistor.

According to a bias circuit of a thirteenth aspect, in the bias circuit of the twelfth aspect, the bias voltage generation circuit further includes a current source connected to the ground, the first transistor is connected between the ground and a first connection point, the first current mirror circuit includes a fourth transistor connected between a power supply voltage and the current source and a fifth transistor connected between the power supply voltage and the first connection point, and the one or more switches are connected between the power supply voltage and the first connection point.

According to a bias circuit of a fourteenth aspect, in the bias circuit of the thirteenth aspect, the first, second, and third transistors are n-channel MOS transistors, and the fourth and fifth transistors are p-channel MOS transistors.

According to a bias circuit of a fifteenth aspect, in the bias circuit of the eighth aspect, the bias voltage generation circuit further includes a sixth transistor that is connected to the first transistor and that passes a larger current than a current flowing through the first current mirror circuit, and the one or more switches turn off the sixth transistor.

According to a bias circuit of a sixteenth aspect, in the bias circuit of the fifteenth aspect, the bias voltage generation circuit further includes a current source connected between the ground and a second connection point, the first transistor is connected between the ground and a first connection point, the first current mirror circuit includes a fourth transistor connected between a power supply voltage and the second connection point and a fifth transistor connected between the power supply voltage and the first connection point, the sixth transistor is connected between the power supply voltage and the first connection point, and the one or more switches include a first switch connected between the second connection point and a gate of the sixth transistor and a second switch connected between the power supply voltage and the gate of the sixth transistor.

According to a bias circuit of a seventeenth aspect, in the bias circuit of the sixteenth aspect, the first, second, and third transistors are n-channel MOS transistors, and the fourth, fifth, and sixth transistors are p-channel MOS transistors.

According to a bias circuit of an eighteenth aspect, in the bias circuit of any one of the eighth to seventeenth aspects, the second and third current mirror circuits pass currents whose magnitude is 1/M of magnitude of a current flowing through the first current mirror circuit, and the second circuit has a time constant which is 1/M of a time constant of the first circuit, M being a natural number.

According to a bias circuit of a nineteenth aspect, in the bias circuit of any one of the eighth to seventeenth aspects, the second and third current mirror circuits pass currents whose magnitude is 1/M of magnitude of a current flowing through the first current mirror circuit, and the second circuit has a time constant which is 1/M of a time constant of the first circuit, M being 1 or a number greater than 1.

According to a bias circuit of a twentieth aspect, in the bias circuit of any one of the seventh to nineteenth aspects, the amplifier circuit is an amplifier circuit for high frequencies.

According to a bias circuit of a twenty-first aspect, in the bias circuit of any one of the seventh to nineteenth aspects, the amplifier circuit amplifies high-frequency signals at 30 GHz or higher.

According to a bias circuit of a twenty-second aspect, in the bias circuit of any one of the seventh to nineteenth aspects, the amplifier circuit amplifies extremely-high-frequency signals.

According to a bias circuit of a twenty-third aspect, in the bias circuit of any one of the seventh to twenty-second aspects, prior to reducing the amount of a current flowing through the first transistor, the bias voltage generation circuit quickly charges the decoupling capacitor.

According to a bias circuit of a twenty-fourth aspect, in the bias circuit of any one of the seventh to twenty-second aspects, prior to reducing the amount of a current flowing through the first transistor, the bias voltage generation circuit completes a charge of the decoupling capacitor within 100 ns.

A signal amplifier according to a twenty-fifth aspect includes an amplifier circuit that amplifies signals and the bias circuit of any one of the seventh to twenty-fourth aspects.

A twenty-sixth aspect provides a method for controlling a bias circuit for use with an amplifier circuit. The bias circuit includes: a first circuit that includes a first resistor and a decoupling capacitor and supplies a bias voltage to the amplifier circuit; a bias voltage generation circuit that includes a first transistor and charges the decoupling capacitor through the first resistor, the first transistor being connected to the first circuit and generating the bias voltage; one or more switches that change the amount of a current flowing through the first transistor; a first replica circuit including a second circuit and a second transistor, the second circuit including a second resistor and a capacitor, the second transistor being connected to the second circuit and generating a pseudo-bias voltage; a second replica circuit including a third transistor that generates a reference voltage; and a comparator that makes a comparison between the pseudo-bias voltage and the reference voltage and outputs a comparison result signal indicating a result of the comparison. The method including when the pseudo-bias voltage reaches or exceeds the reference voltage, controlling the one or more switches on the basis of the comparison result signal to reduce the amount of the current flowing through the first transistor.

As described in detail above, according to the embodiments of the present disclosure, the bias circuit can quickly charge the decoupling capacitor on the bias line of the high-frequency amplifier circuit. Further, the bias circuit can turn on or off the high-frequency amplifier circuit without changing the electrical characteristics thereof. Thus, when a pulse is intermittently transmitted using the high-frequency amplifier circuit, it is possible to reduce the excess start-up time and thus to reduce power consumption.

What is claimed is:

1. A bias circuit for use with an amplifier circuit, comprising:
    a first circuit comprising a first resistor and a decoupling capacitor, the first circuit supplying a bias voltage to the amplifier circuit;
    a bias voltage generation circuit comprising a first transistor and charges the decoupling capacitor through the first resistor, the first transistor being connected to the first circuit and generating the bias voltage;
    one or more switches for changing the amount of a current flowing through the first transistor;
    a first replica circuit comprising a second circuit and a second transistor, the second circuit comprising a second resistor and a capacitor, the second transistor being connected to the second circuit and generating a pseudo-bias voltage;
    a second replica circuit comprising a third transistor that generates a reference voltage;
    a comparator for comparing the pseudo-bias voltage with the reference voltage and outputting a comparison result signal based on a result of the comparison; and
    a control circuit for controlling the one or more switches based on the comparison result signal to reduce the amount of the current flowing through the first transistor when the pseudo-bias voltage reaches or exceeds the reference voltage.

2. The bias circuit according to claim 1, wherein
    the bias voltage generation circuit further comprises a first current mirror circuit connected to the first transistor;
    the first replica circuit further comprises a second current mirror circuit connected to the second transistor; and
    the second replica circuit further comprises a third current mirror circuit connected to the third transistor.

3. The bias circuit according to claim 2, wherein
    the one or more switches are connected to the first current mirror circuit and changes the amount of the current flowing through the first transistor by changing the amount of a current flowing through the first current mirror circuit.

4. The bias circuit according to claim 3, wherein
    the bias voltage generation circuit further comprises a current source connected to a ground,
    the first transistor is connected to the ground,
    the first current mirror circuit comprises a fourth transistor connected between a power supply voltage and the current source and a fifth transistor connected between the power supply voltage and the first transistor, and
    the one or more switches are connected in parallel with the current source.

5. The bias circuit according to claim 4, wherein
    the first, second, and third transistors are n-channel MOS transistors, and
    the fourth and fifth transistors are p-channel MOS transistors.

6. The bias circuit according to claim 2, wherein the one or more switches are connected to the first transistor.

7. The bias circuit according to claim 6, wherein
    the bias voltage generation circuit further comprises a current source connected to a ground,
    the first transistor is connected between the ground and a first connection point,
    the first current mirror circuit comprises a fourth transistor connected between a power supply voltage and the current source and a fifth transistor connected between the power supply voltage and the first connection point, and the one or more switches are connected between the power supply voltage and the first connection point.

8. The bias circuit according to claim 7, wherein
the first, second, and third transistors are n-channel MOS transistors, and
the fourth and fifth transistors are p-channel MOS transistors.

9. The bias circuit according to claim 2, wherein
the bias voltage generation circuit further comprises a sixth transistor that is connected to the first transistor and that passes a larger current than a current flowing through the first current mirror circuit, and
the one or more switches turn off the sixth transistor.

10. The bias circuit according to claim 9, wherein
the bias voltage generation circuit further comprises a current source connected between a ground and a second connection point,
the first transistor is connected between the ground and a first connection point,
the first current mirror circuit comprises a fourth transistor connected between a power supply voltage and the second connection point and a fifth transistor connected between the power supply voltage and the first connection point,
the sixth transistor is connected between the power supply voltage and the first connection point, and
the one or more switches comprise a first switch connected between the second connection point and a gate of the sixth transistor and a second switch connected between the power supply voltage and the gate of the sixth transistor.

11. The bias circuit according to claim 10, wherein
the first, second, and third transistors are n-channel MOS transistors, and
the fourth, fifth, and sixth transistors are p-channel MOS transistors.

12. The bias circuit according to claim 2, wherein
the second and third current mirror circuits pass currents magnitude of which is 1/M of magnitude of a current flowing through the first current mirror circuit, and
the second circuit has a time constant which is 1/M of a time constant of the first circuit, M being a natural number.

13. The bias circuit according to claim 2, wherein
the second and third current mirror circuits pass currents magnitude of which is 1/M of magnitude of a current flowing through the first current mirror circuit, and
the second circuit has a time constant which is 1/M of a time constant of the first circuit, M being a number of one or more.

14. The bias circuit according to claim 1, wherein the amplifier circuit is an amplifier circuit for high frequencies.

15. The bias circuit according to claim 1, wherein the amplifier circuit amplifies high-frequency signals at 30 GHz or higher.

16. The bias circuit according to claim 1, wherein the amplifier circuit amplifies extremely-high-frequency signals.

17. The bias circuit according to claim 1, wherein prior to reducing the amount of a current flowing through the first transistor, the bias voltage generation circuit quickly charges the decoupling capacitor.

18. The bias circuit according to claim 1, wherein prior to reducing the amount of a current flowing through the first transistor, the bias voltage generation circuit completes a charge of the decoupling capacitor within 100 ns.

19. A signal amplifier comprising an amplifier circuit that amplifies signals and a bias circuit for use with the amplifier circuit, wherein
the bias circuit comprises:
a first circuit comprising a first resistor and a decoupling capacitor, the first circuit supplying a bias voltage to the amplifier circuit;
a bias voltage generation circuit comprising a first transistor and charges the decoupling capacitor through the first resistor, the first transistor being connected to the first circuit and generating the bias voltage;
one or more switches for changing the amount of a current flowing through the first transistor;
a first replica circuit comprising a second circuit and a second transistor, the second circuit comprising a second resistor and a capacitor, the second transistor being connected to the second circuit and generating a pseudo-bias voltage;
a second replica circuit comprising a third transistor that generates a reference voltage;
a comparator for comparing the pseudo-bias voltage with the reference voltage and outputting a comparison result signal based on a result of the comparison; and
a control circuit for controlling the one or more switches based on the comparison result signal to reduce the amount of the current flowing through the first transistor when the pseudo-bias voltage reaches or exceeds the reference voltage.

20. A method for controlling a bias circuit for use with an amplifier circuit, wherein the bias circuit comprises:
a first circuit comprising a first resistor and a decoupling capacitor, the first circuit supplying a bias voltage to the amplifier circuit;
a bias voltage generation circuit comprising a first transistor and charges the decoupling capacitor through the first resistor, the first transistor being connected to the first circuit and generating the bias voltage;
one or more switches for changing the amount of a current flowing through the first transistor;
a first replica circuit comprising a second circuit and a second transistor, the second circuit comprising a second resistor and a capacitor, the second transistor being connected to the second circuit and generating a pseudo-bias voltage;
a second replica circuit comprising a third transistor that generates a reference voltage; and
a comparator for comparing the pseudo-bias voltage with the reference voltage and outputting a comparison result signal based on a result of the comparison, the method comprising
controlling the one or more switches based on the comparison result signal to reduce the amount of the current flowing through the first transistor when the pseudo-bias voltage reaches or exceeds the reference voltage.

* * * * *